US008866280B2

(12) United States Patent
Choi et al.

(10) Patent No.: US 8,866,280 B2
(45) Date of Patent: Oct. 21, 2014

(54) CHIP PACKAGE

(75) Inventors: Soo-Min Choi, Kyunggi-do (KR);
Hyeong-No Kim, Kyunggi-Do (KR);
Jae-Sun An, Kyunggi-Do (KR);
Young-Gue Lee, Kyunggi-Do (KR);
Sang-Jin Cha, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/491,742

(22) Filed: Jun. 25, 2009

(65) Prior Publication Data
US 2009/0261470 A1  Oct. 22, 2009

Related U.S. Application Data

(62) Division of application No. 11/565,299, filed on Nov. 30, 2006, now abandoned.

(51) Int. Cl.
*H01L 23/36* (2006.01)
*H01L 23/31* (2006.01)
*H01L 23/552* (2006.01)
*H01L 23/00* (2006.01)

(52) U.S. Cl.
CPC ... *H01L 23/3128* (2013.01); *H01L 2924/15311* (2013.01); *H01L 2224/48091* (2013.01); *H01L 2924/19105* (2013.01); *H01L 2924/01082* (2013.01); *H01L 2924/014* (2013.01); *H01L 23/552* (2013.01); *H01L 2924/15331* (2013.01); *H01L 2924/3025* (2013.01); *H01L 2924/19107* (2013.01); *H01L 2924/19041* (2013.01); *H01L 24/48* (2013.01); *H01L 2924/14* (2013.01); *H01L 24/49* (2013.01); *H01L 2924/01033* (2013.01); *H01L 2924/01047* (2013.01); *H01L 2924/0405* (2013.01); *H01L 2224/4911* (2013.01); *H01L 2224/48227* (2013.01)
USPC .................. 257/678; 257/706; 257/E23.07

(58) Field of Classification Search
USPC .................... 257/704, 706, 780, 678
See application file for complete search history.

(56) References Cited

U.S. PATENT DOCUMENTS

| 6,194,250 B1 * | 2/2001 | Melton et al. ................. 438/126 |
| 6,472,598 B1 | 10/2002 | Glenn |
| 6,472,743 B2 | 10/2002 | Huang et al. |
| 6,479,903 B2 | 11/2002 | Briar |
| 6,602,737 B2 * | 8/2003 | Wu ............................... 438/122 |
| 6,967,403 B2 | 11/2005 | Chuang et al. |
| 7,372,151 B1 * | 5/2008 | Fan et al. ..................... 257/738 |
| 2002/0093108 A1 | 7/2002 | Grigorov |

(Continued)

*Primary Examiner* — Mark Tornow
*Assistant Examiner* — Abbigale Boyle
(74) *Attorney, Agent, or Firm* — Foley & Lardner LLP; Cliff Z. Liu; Angela D. Murch

(57) ABSTRACT

A chip package comprising a carrier, a chip, a plurality of first conductive elements, an encapsulation, and a conductive film is provided. The carrier has a carrying surface and a back surface opposite to the carrying surface. Furthermore, the carrier has a plurality of common contacts in the periphery of the carrying surface. The chip is disposed on the carrying surface and electrically connected to the carrier. In addition, the first conductive elements are disposed on the common contacts respectively. The encapsulation is disposed on the carrying surface and encapsulating the chip. Moreover, the conductive film is disposed over the encapsulation and the first conductive elements, so as to electrically connect with the common contacts via the first conductive elements. A process for fabricating the chip package is further provided. The chip package is capable of preventing the EMI problem and thus provides superior electrical performance.

7 Claims, 9 Drawing Sheets

(56) References Cited

U.S. PATENT DOCUMENTS

| | | | |
|---|---|---|---|
| 2002/0113308 A1* | 8/2002 | Huang et al. | 257/717 |
| 2004/0063242 A1 | 4/2004 | Karnezos | |
| 2006/0148317 A1* | 7/2006 | Akaike et al. | 439/607 |

\* cited by examiner

CHIP PACKAGE

CROSS-REFERENCE TO RELATED APPLICATION

This is a divisional application of and claims the priority benefit of patent application Ser. No. 11/565,299, filed on Nov. 30, 2006. The entirety of the above-mentioned patent application is hereby incorporated by reference herein and made a part of this specification.

BACKGROUND OF THE INVENTION

1. Field of the Invention

The present invention generally relates to a chip package. More particularly, the present invention relates to a chip package having electromagnetic interference (EMI) shielding function.

2. Description of Related Art

In the manufacturing of integrated circuits, ultimate size of the package is an important issue. As the level of integration and functions of integrated circuits increase, the number of conductive leads required for connections with external circuitry is also increased. Furthermore, as the operating speed of chip goes higher, the amount of heat generated by the chip and electrical interference caused by external electromagnetic fields during operation can no longer be ignored. A typical high-density area array package is the ball grid array (BGA) type package. Nonetheless, the thermal dissipation and the EMI problems of the BGA type package or even other types of chip package are still unresolved, and need to be carefully considered in the design of a high-density area array package.

SUMMARY OF THE INVENTION

Accordingly, the present invention is directed to a chip package which is capable of eliminating the EMI problem and provides superior electrical performance.

The present invention is also directed to a fabricating process of the chip package having EMI shielding ability.

As embodied and broadly described herein, the present invention provides a chip package comprising a carrier, a chip, a plurality of first conductive elements, an encapsulation, and a conductive film. The carrier has a carrying surface and a back surface opposite to the carrying surface. Furthermore, the carrier has a plurality of common contacts in the periphery of the carrying surface. The chip is disposed on the carrying surface and electrically connected to the carrier. In addition, the first conductive elements are disposed on the common contacts respectively. The encapsulation is disposed on the carrying surface and encapsulating the chip. Moreover, the conductive film is disposed over the encapsulation and the first conductive elements, so as to electrically connect with the common contacts via the first conductive elements.

The present invention also provides a chip packaging process, comprising: providing a carrier which has a carrying surface and a back surface opposite to the carrying surface, the carrier further having a plurality of common contacts in the periphery of the carrying surface; disposing a chip on the carrying surface and electrically connecting the chip to the carrier; forming an encapsulation on the carrying surface, wherein the encapsulation encapsulates the chip; forming a plurality of first conductive elements on the corresponding common contacts; and providing a conductive film on the encapsulation and electrically connecting the conductive film to the common contacts via the first conductive elements.

The present invention further provides a chip packaging process, comprising: providing a carrier which has a carrying surface and a back surface opposite to the carrying surface, the carrier further having a plurality of common contacts in the periphery of the carrying surface; disposing a chip on the carrying surface and electrically connecting the chip to the carrier; forming a plurality of first conductive elements on the corresponding common contacts; forming an encapsulation for covering the carrying surface and encapsulating the chip and the first conductive elements, wherein the encapsulation exposes a top portion of each first conductive element; providing a conductive film and forming a plurality of second conductive elements on a surface of the conductive film; and disposing the conductive film over the encapsulation and connecting the second conductive elements to the corresponding first conductive elements, wherein the conductive film is electrically connected to the common contacts via the first conductive elements and the second conductive elements.

Moreover, the present invention provides a chip packaging process, comprising: providing a carrier which has a carrying surface and a back surface opposite to the carrying surface, the carrier further having a plurality of common contacts in the periphery of the carrying surface; disposing a chip on the carrying surface and electrically connecting the chip to the carrier; forming a plurality of first conductive elements on the corresponding common contacts; forming an encapsulation for covering the carrying surface and encapsulating the chip and the first conductive elements, the encapsulation exposing a top portion of each first conductive element; and forming a conductive film on a top surface of the encapsulation so as to electrically connect the conductive film to the common contacts via the first conductive elements.

To sum up, the present invention disposes the conductive film over the encapsulation to form a common plane in the chip package, so as to solve the problem of EMI for the chip package. Therefore, products utilizing the chip package and the chip packaging process can achieve superior electrical performance and higher reliability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
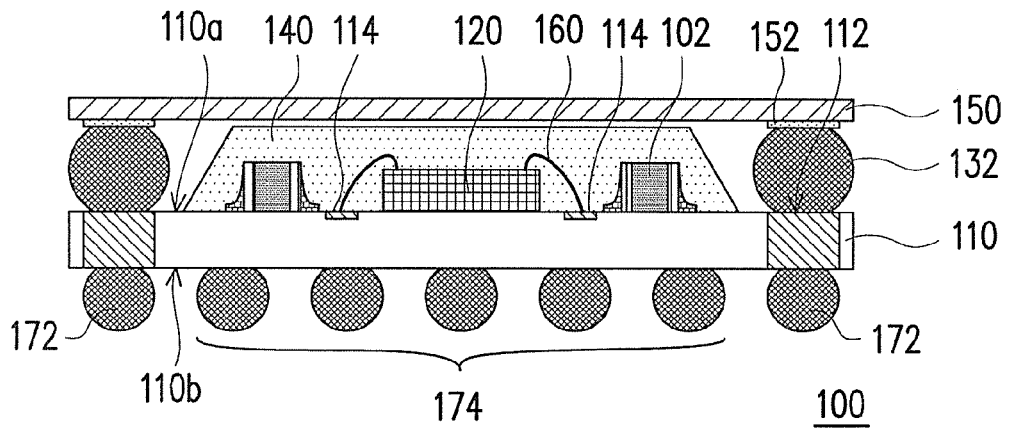
FIG. 1A illustrates a chip package according to an embodiment of the present invention.

The present invention proposes a chip package with EMI shielding to improve the electrical performance and the reliability thereof. Embodiments are now given in the following to illustrate various arrangements of the chip package of the present invention. Furthermore, the accompanying fabricating processes of the chip package are also illustrated in the corresponding embodiments.

Reference will now be made in detail to the present embodiments of the invention, examples of which are illustrated in the accompanying drawings. Wherever possible, the same reference numbers are used in the drawings and the description to refer to the same or like parts.

FIG. 1A illustrates a chip package according to an embodiment of the present invention. Referring to FIG. 1A, the chip package 100 includes a carrier 110, a chip 120, first conductive elements 132, an encapsulation 140, and a conductive film 150. The carrier 110 has a carrying surface 110a and a back surface 110b opposite to the carrying surface 110a, wherein a plurality of common contacts 112 and bonding pads 114 is disposed in the periphery of the carrying surface 110a. It is noted that the embodiment shows a BGA type chip package 100 which utilize a circuit substrate as the carrier 110, however, there is no set limit on the type of carrier, while other known appropriate chip package type, such as Pin Grid Array (PGA) type, Quad Flat Package (QFP) type and so on, can also be carried out in the present invention.

In addition, the chip 120 is disposed on the carrying surface 110a of the carrier 110 and is electrically connected with the carrier 110 by performing, for example, a wire bonding process, wherein the chip 120 is connected to the bonding pads 114 of the carrier 110 via plural wires 160. It is noted that there is no limit on the manners for bonding the chip 120 and the carrier 110 in the present invention. For example, a flip chip bonding process may be carried out in another embodiment of the present invention to connect the chip 120 with the carrier 110 via a plurality of conductive bumps (not shown).

The first conductive elements 132 are disposed on the common contacts 112 respectively. For example, the first conductive elements 132 can be solder balls or other appropriate conductive objects, such as solder bumps. In the embodiment, there may also be some peripheral devices 102 disposed on the carrying surface 110a of the carrier 110, wherein the peripheral devices 102 may be passive devices, such as capacitors, resistors, or inductors, which are electrically connected with the chip 120 via the carrier 110.

The encapsulation 140 is disposed on the carrying surface 110a of the carrier 110 to encapsulate the chip 120, the bonding pads 114, the wires 160 and the peripheral devices 102. Besides, the encapsulation 140 exposes the common contacts 112 and the first conductive elements 132 thereon. In other words, the first conductive elements 132 are arranged around the encapsulation 140. Moreover, the conductive film 150 is disposed over the encapsulation 140 and the first conductive elements 132, so as to be electrically connected with the common contacts 112 via the first conductive elements 132. By applying a common voltage on the conductive film 150 through the common contacts 112, the conductive film 150 can serve as a common plane in the chip package 100 to provide an EMI shielding effect. Specifically, the conductive film 150 of the embodiment can be manufactured by providing a metal sheet. Furthermore, the periphery surface of the conductive film 150 is coated with a conductive bonding layer 152, such as a solder layer. The conductive film 150 is connected with the first conductive elements 132 via the conductive bonding layer 152.

The chip package 100 further comprise a plurality of solder balls 172 and 174 arranged in array on the back surface 110b of the carrier 110. The solder balls 172 are distributed in the periphery of the back surface 110b and connected with the common contacts 112. Thus, the conductive film 150 can be electrically connected with an external circuitry for the common voltage via the solder balls 172. Besides, the solder balls 174 are distributed in the center region of the back surface 110b and electrically connected with the bonding pads 114 via the carrier 110. The chip 120 and the peripheral devices 102 can be connected with another external circuitry for driving signals via the solder balls 174.

It should be noted that, in the present invention, the chip and the peripheral devices may further be electrically connected with the common contacts to share the common voltage with the conductive film by rearranging the wires and the interconnections of the carrier.

Figure 1B:
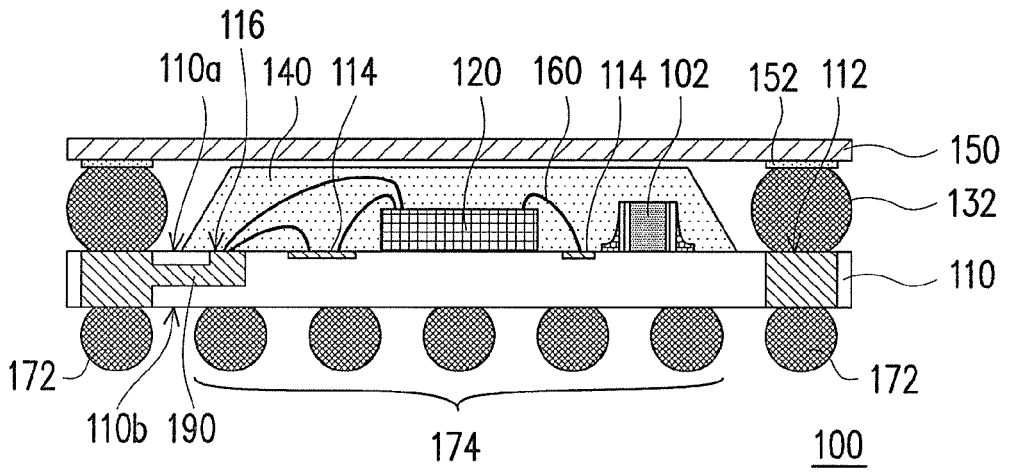
FIG. 1B and FIG. 1C show other chip packages utilizing different types of circuit substrate as carriers in comparison with that in FIG. 1A.
Figure 1C:
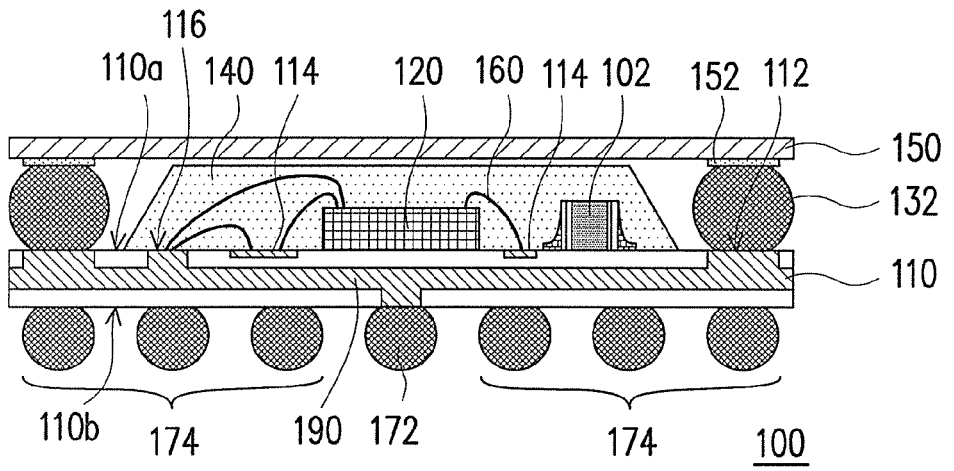

Accordingly, FIG. 1B and FIG. 1C show other chip packages utilizing different types of circuit substrate as carriers respectively according to other embodiments of the present invention. Since most of the elements in the chip packages of FIG. 1B and FIG. 1C have been described in the aforementioned embodiment, details are not repeated herein.

Referring to FIG. 1B, expect the common contacts 112, the carrier 100 further has at least one extending contact 116 on the carrying surface 110a, wherein the extending contact 116 is electrically connected with the common contacts 112 via the interconnections 190 in the carrier 110. In addition, the chip 120 and the bonding pads 114 may be electrically connected with the extending contact 116 via a part of the wires 160. Thus, the chip 120 and the peripheral devices 102 can take the common voltage from the common contacts 112 as, for example, a ground voltage.

FIG. 1C shows another chip package 100 with different arrangement of solder balls, wherein the solder balls 172 for providing the common voltage is disposed in the center region of the back surface 110b and electrically connected with the common contacts 112 via the interconnections 190 in the carrier 110. In addition, the solder balls 174 for providing the driving signals are distributed in the periphery of the back surface 110b and electrically connected with the bonding pads 114 via the carrier 110.

For providing a more detailed and clear disclosure of the present invention, a chip package process for fabricating the aforementioned chip packages 100 is illustrated in the following. Since most of the elements of the chip packages 100 have been mentioned in the aforementioned embodiments, detailed descriptions are not repeated in the following.

Figure 2A:
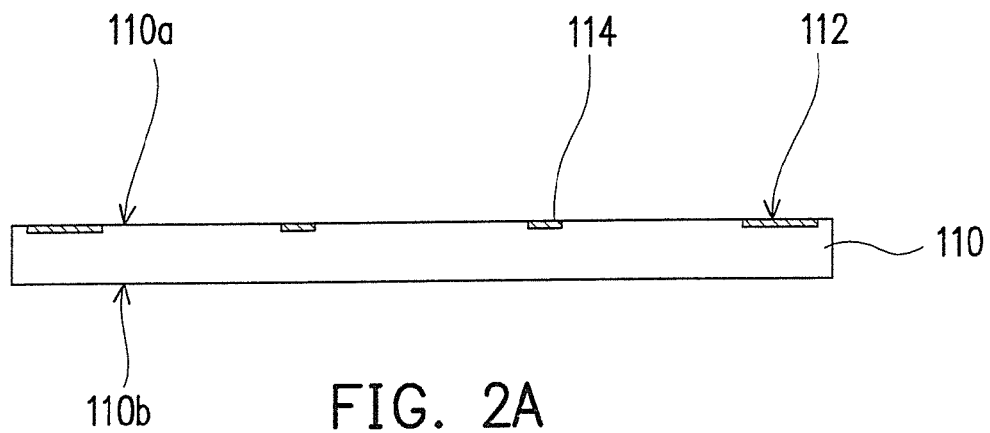
FIGS. 2A~2E show a chip package process of the chip packages in FIGS. 1A~1C according to an embodiment of the present.
Figure 2B:
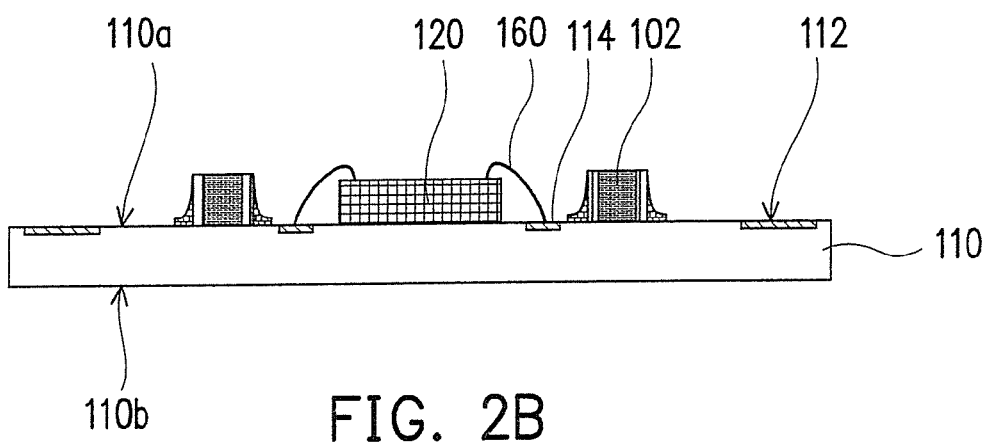

FIGS. 2A~2E show the chip package process according to an embodiment of the present. First, as shown in FIG. 2A, the carrier 110 having the carrying surface 110a and the back surface 110b is provided. Then, as shown in FIG. 2B, the chip 120 and the peripheral devices 102 are disposed on the carrying surface 110a of the carrier 110. The chip is bonded to the carrier 110 by wire bonding, flip chip bonding or other appropriate bonding manners. In addition, the peripheral devices 102 may be mounted on the carrier 110 by surface mount technology (SMT).

Figure 2C:
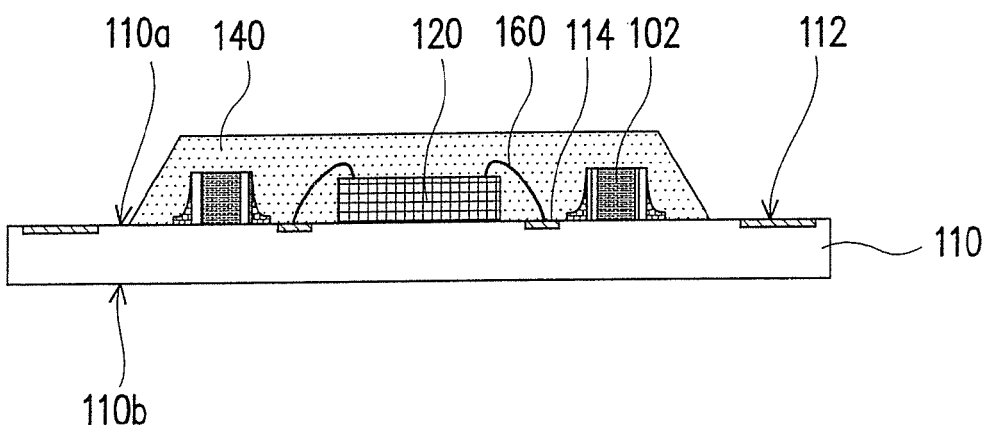
Figure 2D:
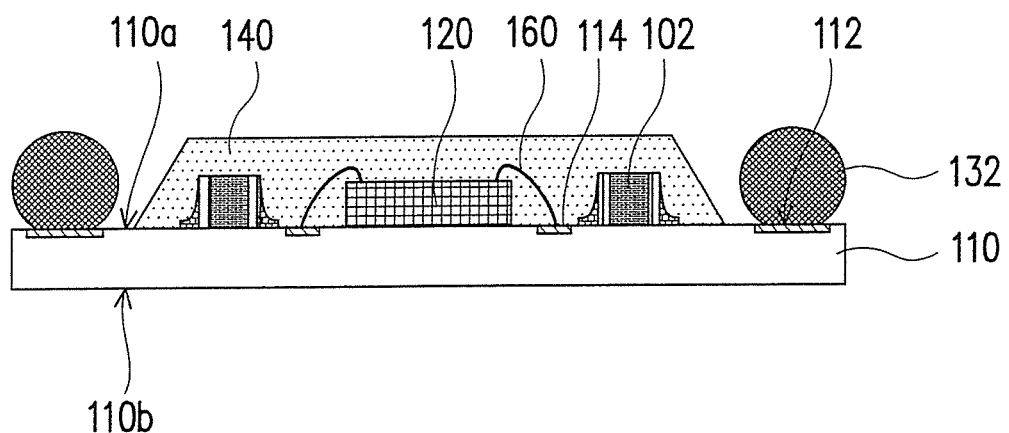

Next, as shown in FIG. 2C, the encapsulation 140 is formed on the carrying surface 110a of the carrier to encapsulate the chip 120, the bonding pads 114, the wires 160 and the peripheral devices 102. Thereafter, as shown in FIG. 2D, the first conductive elements 132 are formed on the corresponding common contacts 112, wherein the first conductive elements 132 surround the encapsulation 140. In the embodiment, the first conductive elements 132 are fabricated by forming a solder ball on each common contact 112 respectively.

Figure 2E:
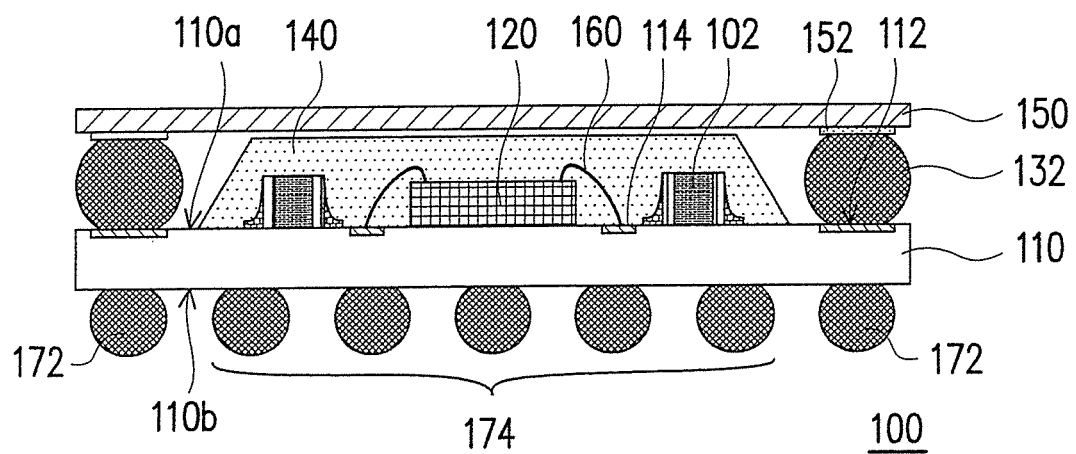

Then, as shown in FIG. 2E, the conductive film 150 is provided on the encapsulation 140 and electrically connected with the common contacts 112 via the first conductive elements 132. Herein, the conductive bonding layer 152 is formed between the conductive film 150 and the first conductive elements 132 before providing the conductive film 150 on the encapsulation 140, so as to connect the conductive film 150 to the first conductive elements 132 via the conductive bonding layer 152. After that, the solder balls 172 and 174 can be selectively formed on the back surface 110b of the carrier 110, wherein the solder balls 172 and 174 are electrically connected with the chip 120, the peripheral devices 102 and/or the first conductive elements 132 via the carrier 110 respectively.

It is noted that the above fabricating process as shown in FIGS. 2A-2E focuses on a single chip package. Practically, the above fabricating process is applied on an array type carrier and then forms a plurality of chip packages at the same time. Thus, a singulation process may further be carried out after the steps mentioned above to achieve a single chip package.

In addition to the above embodiments, other types of chip packages and the corresponding fabricating processes thereof are illustrated in the following.

Figure 3A:
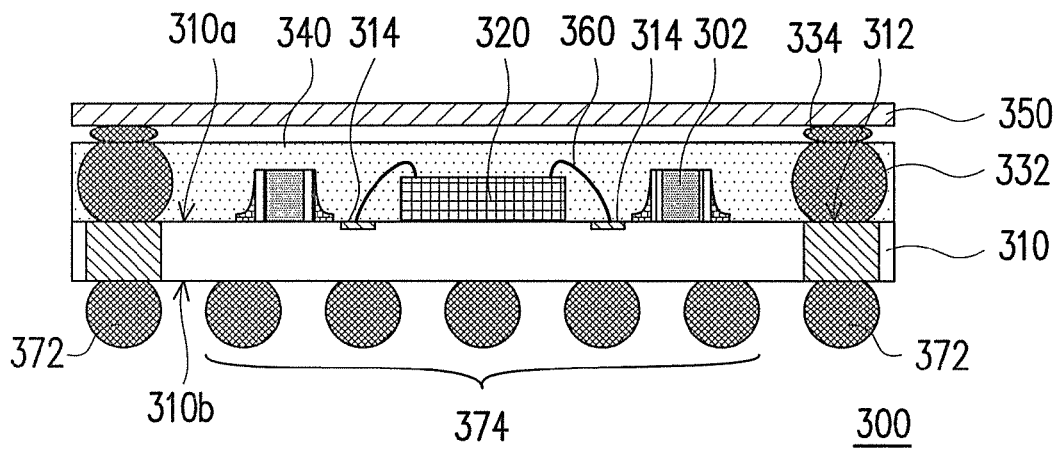
FIG. 3A illustrates a chip package according to another embodiment of the present invention.

FIG. 3A illustrates a chip package according to another embodiment of the present invention. Referring to FIG. 3A, the chip package 300 includes a carrier 310, a chip 320, first conductive elements 332, second conductive elements 334, an encapsulation 340, and a conductive film 350. The carrier 310 has a carrying surface 310a and a back surface 310b opposite to the carrying surface 310a. A plurality of common contacts 312 and bonding pads 314 is disposed in the periphery of the carrying surface 310a. It is noted that the embodiment shows a BGA type chip package 300 which utilize a circuit substrate as the carrier 310, however, there is no set limit on the type of carrier, while other known appropriate chip package type, such as PGA type, QFP type and so on, can also be carried out in the present invention.

The chip 320 is disposed on the carrying surface 310a of the carrier 310 and is electrically connected with the carrier 310 by performing, for example, a wire bonding process, wherein the chip 320 is connected to the bonding pads 314 of the carrier 310 via plural wires 360. It is noted that there is no limit on the manners for bonding the chip 320 and the carrier 310 in the present invention. For example, a flip chip bonding process may be carried out in another embodiment of the present invention to connect the chip 320 with the carrier 310 via a plurality of conductive bumps (not shown).

The first conductive elements 332 are disposed on the common contacts 312 respectively. For example, the first conductive elements 332 can be solder balls or other appropriate conductive objects, such as solder bumps. In the embodiment, there may also be some peripheral devices 302 disposed on the carrying surface 310a of the carrier 310, wherein the peripheral devices 302 may be passive devices, such as capacitors, resistors, or inductors, which are electrically connected with the chip 320 via the carrier 310.

The encapsulation 340 is disposed on the whole carrying surface 310a of the carrier 310 to encapsulate the chip 320, the first conductive elements 332, the common contacts 312, the bonding pads 314, the wires 360 and the peripheral devices 302. Particularly, the encapsulation 340 exposes a top portion of each first conductive element 332. In addition, the conductive film 350 is disposed over the encapsulation 340 and the first conductive elements 332. The second conductive elements 334 are disposed between the conductive film 350 and the corresponding first conductive elements 332 respectively, so as to electrically connect the conductive film 350 with the common contacts 312. In the embodiment, the second conductive elements 334 may be solder balls or other appropriate conductive elements such as solder bumps, or silver paste.

By applying a common voltage on the conductive film 350 through the common contacts 312, the conductive film 350 can serve as a common plane in the chip package 300 to provide an EMI shielding effect. Specifically, the conductive film 350 of the embodiment can be manufactured by providing a metal sheet. Then, the second conductive elements 334 are disposed in the periphery surface of the conductive film 350. Therefore, the conductive film 350 can be electrically connected with the first conductive elements 332 via the second conductive elements 334.

The chip package 300 further comprise a plurality of solder balls 372 and 374 arranged in array on the back surface 310b of the carrier 310. The solder balls 372 are distributed in the periphery of the back surface 310b and connected with the common contacts 312. Thus, the conductive film 350 can be electrically connected with an external circuitry for the common voltage via the solder balls 372. Besides, the solder balls 374 are distributed in the center region of the back surface 310b and electrically connected with the bonding pads 314 via the carrier 310. The chip 320 and the peripheral devices 302 can be connected with another external circuitry for driving signals via the solder balls 374.

Figure 3B:
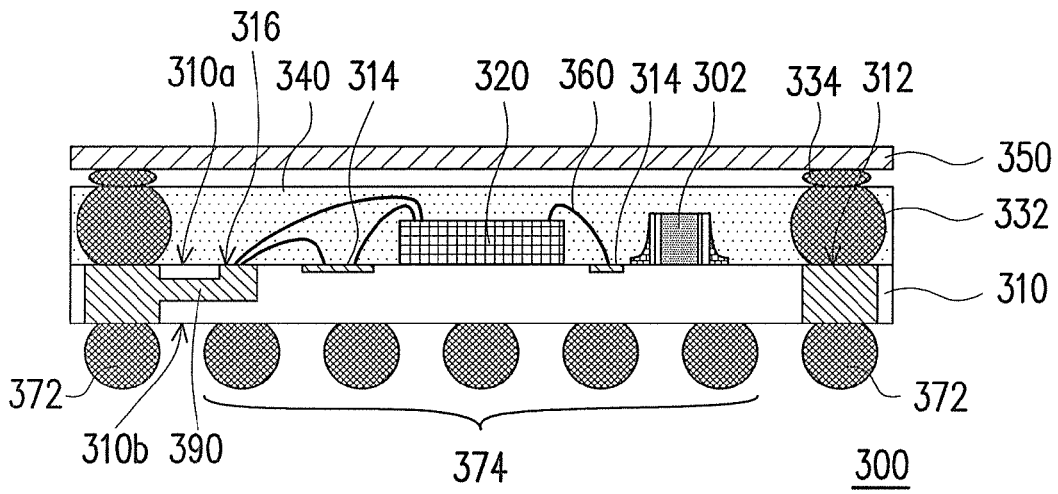
FIG. 3B and FIG. 3C respectively show other chip packages utilizing different types of circuit substrate as carriers in comparison with that in FIG. 3A.
Figure 3C:
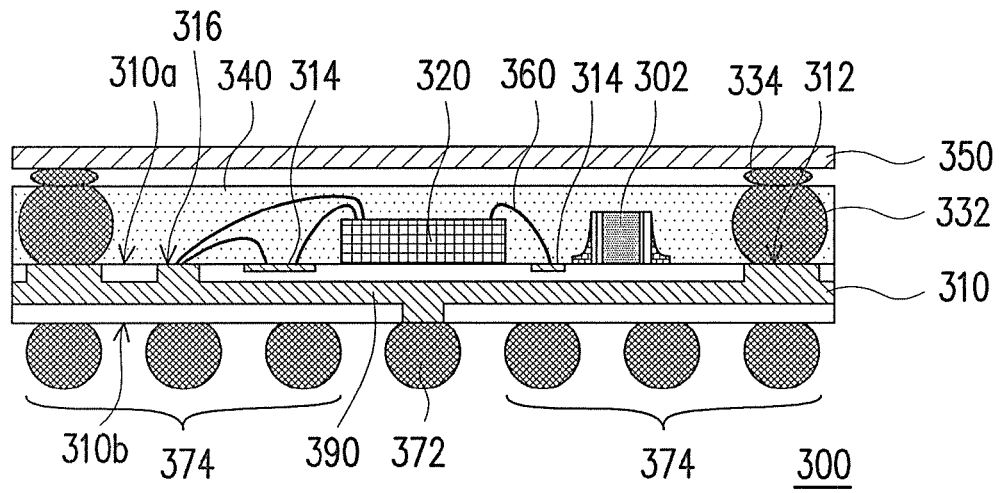

Similar to the above illustrations of FIG. 1B and FIG. 1C, the chip 320 and the peripheral devices 302 of the aforementioned embodiment may further be electrically connected with the common contacts 312 to share the common voltage with the conductive film 350 by rearranging the wires 360 and the interconnections of the carrier 310. Referring to FIG. 3B and FIG. 3C, which respectively show other chip packages utilizing different types of circuit substrate as carriers according to other embodiments of the present invention. Since most of the elements in the chip packages of FIG. 3B and FIG. 3C have been described in the aforementioned embodiment, details are not repeated herein.

As shown in FIG. 3B, expect the common contacts 312, the carrier 300 further has at least one extending contact 316 on the carrying surface 310a, wherein the extending contact 316 is electrically connected with the common contacts 312 via the interconnections 390 in the carrier 310. In addition, the chip 320 and the bonding pads 314 may be electrically connected with the extending contact 316 via a part of the wires 360. Thus, the chip 320 and the peripheral devices 302 can take the common voltage from the common contacts 312 as, for example, a ground voltage.

FIG. 3C shows another chip package 300 with different arrangement of solder balls, wherein the solder balls 372 for providing the common voltage is disposed in the center region of the back surface 310b and electrically connected with the common contacts 312 via the interconnections 390 in the carrier 310. In addition, the solder balls 374 for providing the driving signals are distributed in the periphery of the back surface 310b and electrically connected with the bonding pads 314 via the carrier 310.

In order to provide a more detailed and clear disclosure of the present invention, a chip package process for fabricating the aforementioned chip packages 300 is illustrated in the following. Since most of the elements of the chip packages 300 have been mentioned in the aforementioned embodiments, detailed descriptions are not repeated in the following.

Figure 4A:
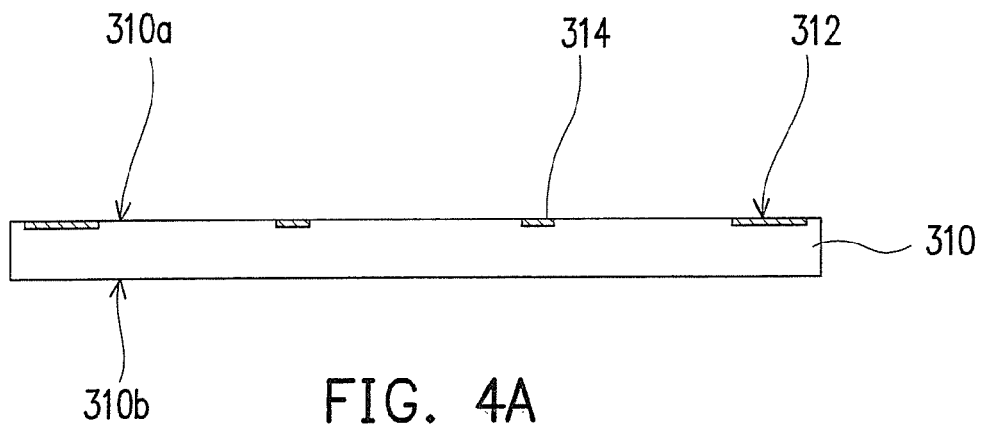
FIGS. 4A~4F show a chip package process of the chip packages in FIGS. 3A~3C according to an embodiment of the present.
Figure 4B:
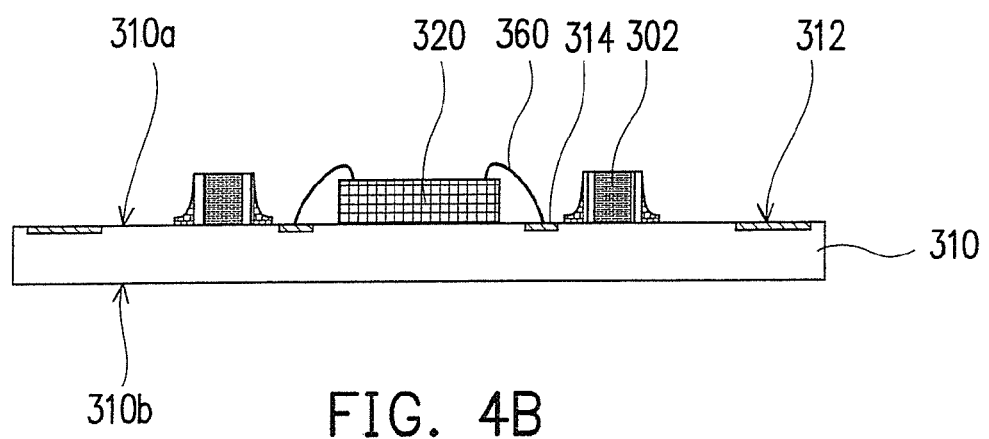

FIGS. 4A~4F show the chip package process according to an embodiment of the present. First, as shown in FIG. 4A, the carrier 310 having the carrying surface 310a and the back surface 310b is provided. Then, as shown in FIG. 4B, the chip 320 and the peripheral devices 302 are disposed on the carrying surface 310a of the carrier 310. The chip is bonded to the carrier 310 by wire bonding, flip chip bonding or other appropriate bonding manners. In addition, the peripheral devices 302 may be mounted on the carrier 310 by SMT.

Figure 4C:
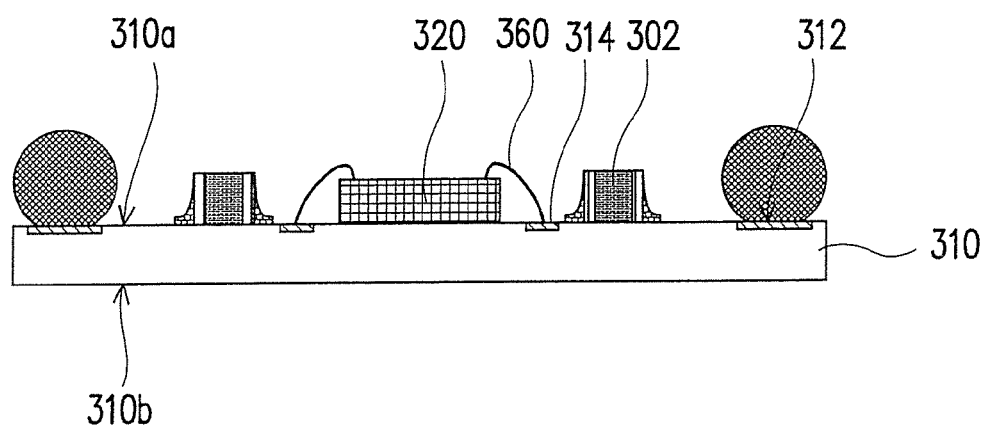
Figure 4D:
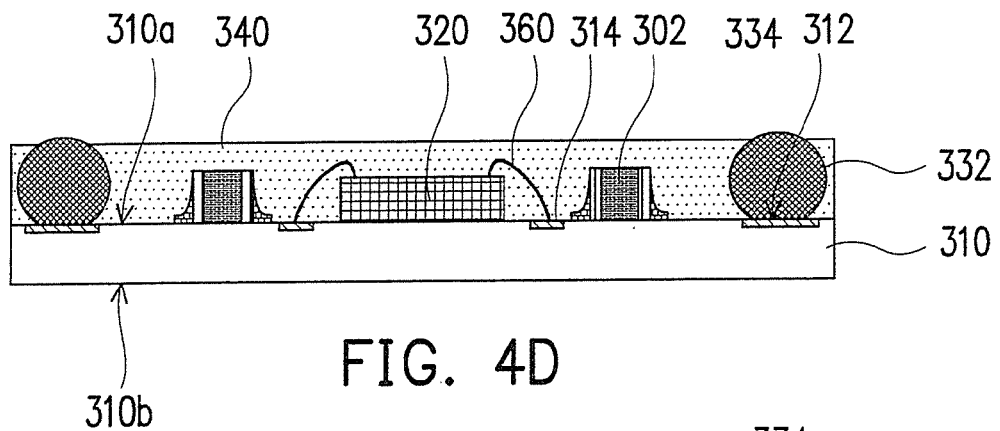

Next, as shown in FIG. 4C, the first conductive elements 332 are formed on the corresponding common contacts 312. In the embodiment, the first conductive elements 332 are fabricated by forming a solder ball on each common contact 312 respectively. Then, as shown in FIG. 4D, the encapsulation 340 is formed on the whole carrying surface 310a of the carrier to encapsulate the chip 320, the peripheral devices 302, the common contacts 312, the bonding pads 314, the wires 360 and the first conductive elements 332. It is noted that the encapsulation 340 shall expose a top portion of each first conductive element 332.

Figure 4E:
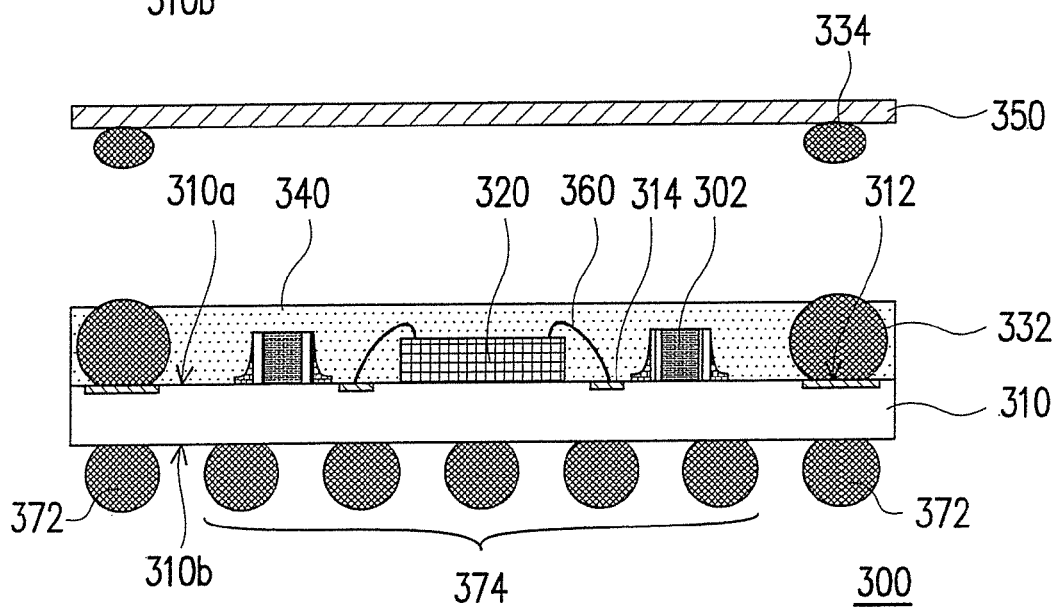

Thereafter, as shown in FIG. 4E, the conductive film 350 is provided and the second conductive elements 334 are formed on a surface of the conductive film 350. In the embodiment, the second conductive elements 334 are fabricated by forming a plurality of solder balls on the conductive film 350.

Figure 4F:
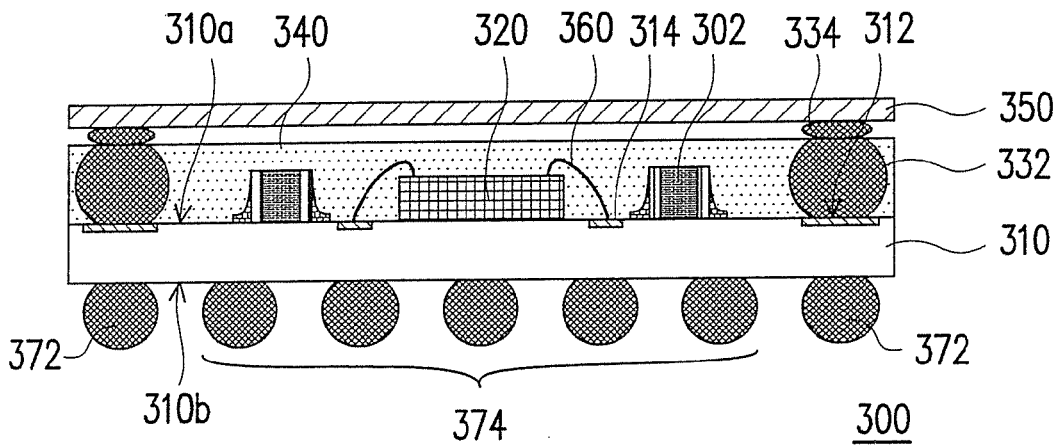

Then, as shown in FIG. 4F, the conductive film 350 is disposed on the encapsulation 340 and the second conductive elements 334 on the conductive film 350 are connected to the corresponding first conductive elements 332, wherein the conductive film 350 is electrically connected to the common contacts 312 via the first conductive elements 332 and the second conductive elements 334. After that, the solder balls 372 and 374 can be selectively formed on the back surface 310b of the carrier 310, wherein the solder balls 372 and 374 are electrically connected with the chip 320, the peripheral devices 302, and/or the first conductive elements 332 via the carrier 310 respectively.

It is noted that the above fabricating process as shown in FIGS. 4A-4F focuses on a single chip package. Practically, the above fabricating process is applied on an array type carrier and then forms a plurality of chip packages at the same time. Thus, a singulation process may further be carried out after the steps mentioned above to achieve a single chip package.

Figure 5A:
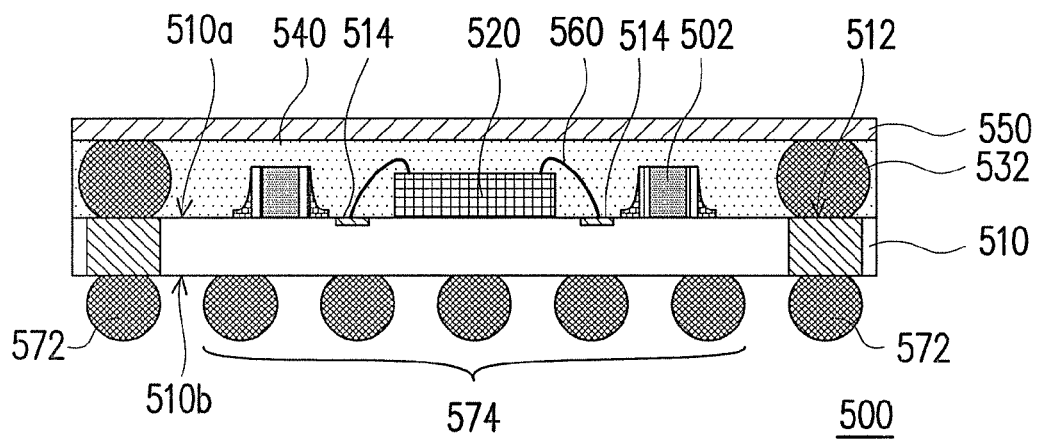
FIG. 5A illustrates a chip package according to further another embodiment of the present invention.

FIG. 5A illustrates a chip package according to further another embodiment of the present invention. Referring to FIG. 5A, the chip package 500 includes a carrier 510, a chip 520, first conductive elements 532, an encapsulation 540, and a conductive film 550. The carrier 510 has a carrying surface 510a and a back surface 510b opposite to the carrying surface 510a. A plurality of common contacts 512 and bonding pads 514 is disposed in the periphery of the carrying surface 510a. It is noted that the embodiment shows a BGA type chip package 500 which utilize a circuit substrate as the carrier 510, however, there is no set limit on the type of carrier, while other known appropriate chip package type, such as PGA type, QFP type and so on, can also be carried out in the present invention.

The chip 520 is disposed on the carrying surface 510a of the carrier 510 and is electrically connected with the carrier 510 by performing, for example, a wire bonding process, wherein the chip 520 is connected to the bonding pads 514 of the carrier 510 via plural wires 560. It is noted that there is no limit on the manners for bonding the chip 520 and the carrier 510 in the present invention. For example, a flip chip bonding process may be carried out in another embodiment of the present invention to connect the chip 520 with the carrier 510 via a plurality of conductive bumps (not shown).

The first conductive elements 532 are disposed on the common contacts 512 respectively. For example, the first conductive elements 532 can be solder balls or other appropriate conductive objects, such as solder bumps. In the embodiment, there may also be some peripheral devices 502 disposed on the carrying surface 510a of the carrier 510, wherein the peripheral devices 502 may be passive devices, such as capacitors, resistors, or inductors, which are electrically connected with the chip 520 via the carrier 510.

The encapsulation 540 is disposed on the whole carrying surface 510a of the carrier 510 to encapsulate the chip 520, the first conductive elements 532, the common contacts 512, the bonding pads 514, the wires 560 and the peripheral devices 502. Particularly, the encapsulation 540 exposes a top portion of each first conductive element 532. In addition, the conductive film 550 is directly attached on a top surface of the encapsulation 540 so as to connect with the first conductive elements 532.

By applying a common voltage on the conductive film 550 through the common contacts 512, the conductive film 550 can serve as a common plane in the chip package 500 to provide an EMI shielding effect. Specifically, the conductive film 550 of the embodiment can be manufactured by spraying a conductive material on the top surface of the encapsulation 540. Therefore, the conductive film 550 can be electrically connected with the common contacts 512 via the first conductive elements 532.

The chip package 500 further comprise a plurality of solder balls 572 and 574 arranged in array on the back surface 510b of the carrier 510. The solder balls 572 are distributed in the periphery of the back surface 510b and connected with the common contacts 512. Thus, the conductive film 550 can be electrically connected with an external circuitry for the common voltage via the solder balls 572. Besides, the solder balls 574 are distributed in the center region of the back surface 510b and electrically connected with the bonding pads 514 via the carrier 510. The chip 520 and the peripheral devices 502 can be connected with another external circuitry for driving signals via the solder balls 574.

Figure 5B:
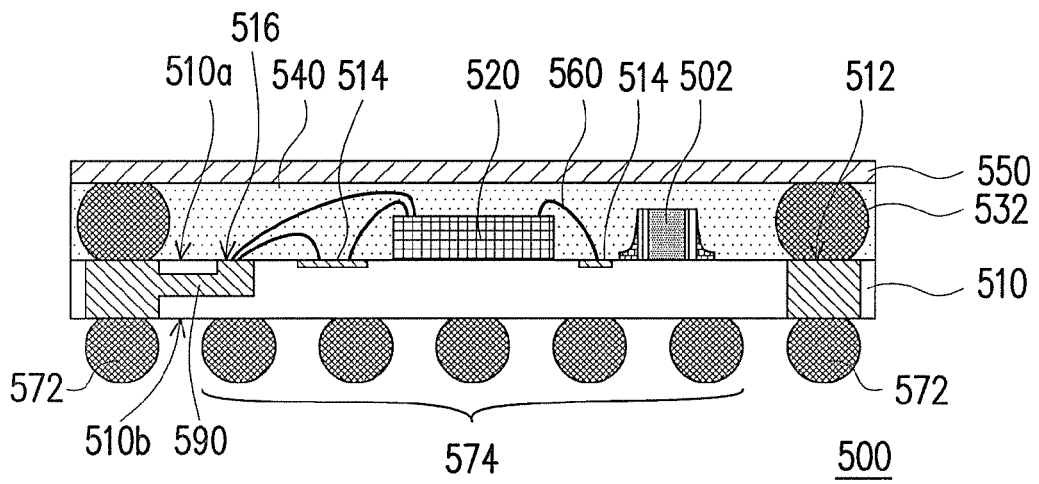
FIG. 5B and FIG. 5C respectively show other chip packages utilizing different types of circuit substrate as carriers in comparison with that in FIG. 5A.
Figure 5C:
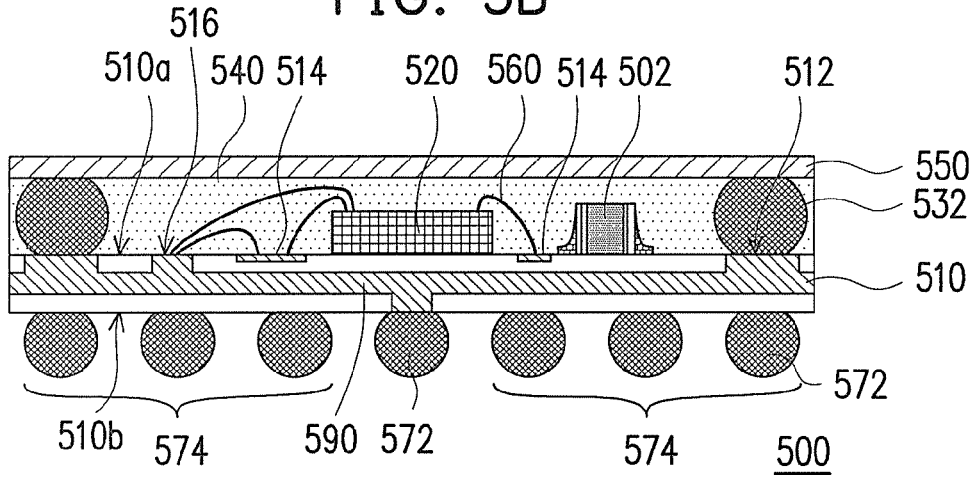

Similar to the above illustrations of FIGS. 1B, 1C and FIGS. 3B, 3C, the chip 520 and the peripheral devices 502 of the aforementioned embodiment may further be electrically connected with the common contacts 512 to share the common voltage with the conductive film 550 by rearranging the wires 560 and the interconnections of the carrier 510. Referring to FIG. 5B and FIG. 5C, which respectively show other chip packages utilizing different types of circuit substrate as carriers in comparison with that in FIG. 5A. Since most of the elements in the chip packages of FIG. 5B and FIG. 5C have been described in the aforementioned embodiment, details are not repeated herein.

As shown in FIG. 5B, in addition to the common contacts 512, the carrier 500 further has at least one extending contact 516 on the carrying surface 510a, wherein the extending contact 516 is electrically connected with the common contacts 512 via the interconnections 590 in the carrier 510. In addition, the chip 520 and the bonding pads 514 may be electrically connected with the extending contact 516 via a part of the wires 560. Thus, the chip 520 and the peripheral devices 502 can take the common voltage from the common contacts 512 as, for example, a ground voltage.

FIG. 5C shows another chip package 500 with different arrangement of solder balls, wherein the solder balls 572 for providing the common voltage is disposed in the center region of the back surface 510b and electrically connected with the common contacts 512 via the interconnections 590 in the carrier 510. In addition, the solder balls 574 for providing the driving signals are distributed in the periphery of the back surface 510b and electrically connected with the bonding pads 514 via the carrier 510.

In order to provide a more detailed and clear disclosure of the present invention, a chip package process for fabricating the aforementioned chip packages 500 is illustrated in the following. Since most of the elements of the chip packages 500 have been mentioned in the aforementioned embodiments, detailed descriptions are not repeated in the following.

Figure 6A:
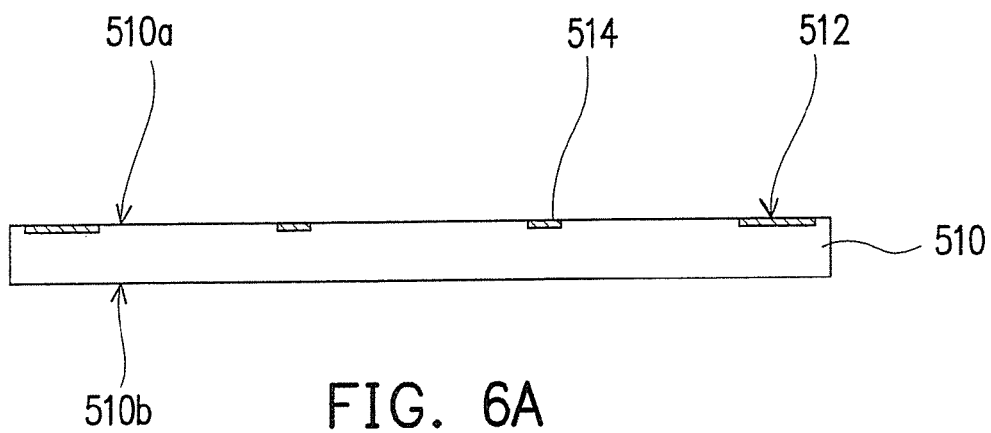
FIGS. 6A~6E show a chip package process of the chip packages in FIGS. 5A~5C according to an embodiment of the present.
Figure 6B:
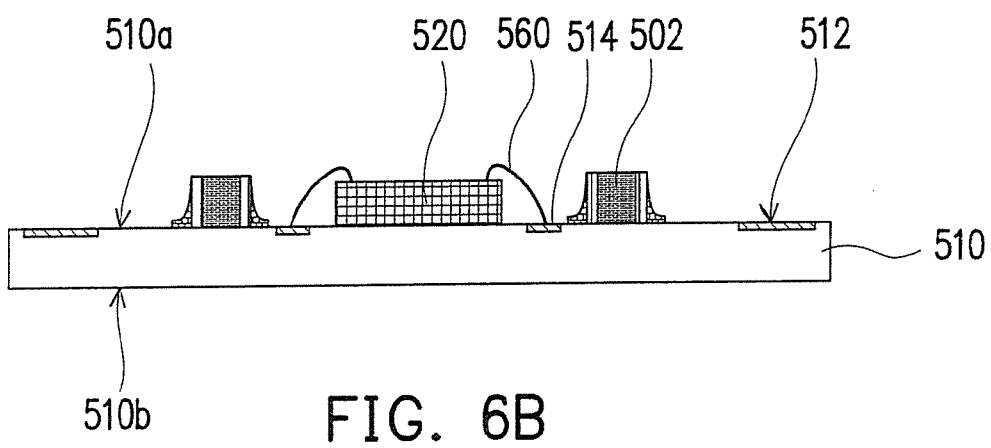

FIGS. 6A~6E show the chip package process according to an embodiment of the present. First, as shown in FIG. 6A, the carrier 510 having the carrying surface 510a and the back surface 510b is provided. Then, as shown in FIG. 6B, the chip 520 and the peripheral devices 502 are disposed on the carrying surface 510a of the carrier 510. The chip is bonded to the carrier 510 by wire bonding, flip chip bonding or other appropriate bonding manners. In addition, the peripheral devices 502 may be mounted on the carrier 510 by SMT.

Figure 6C:
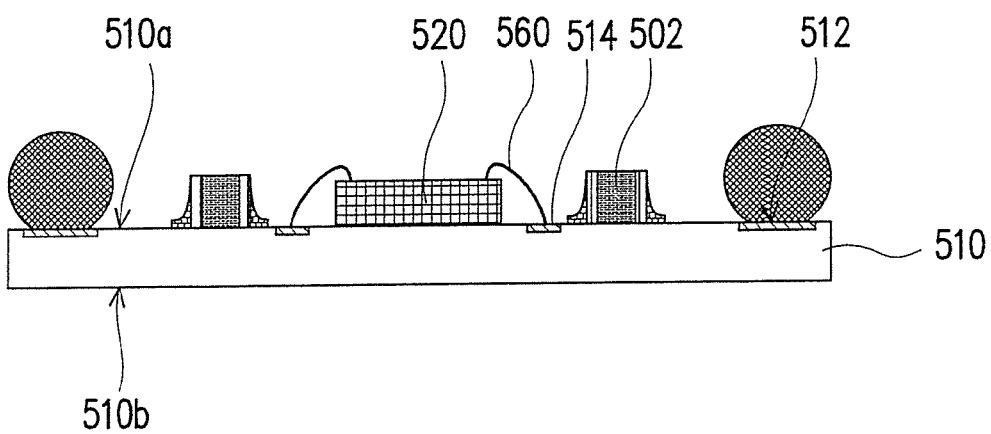
Figure 6D:
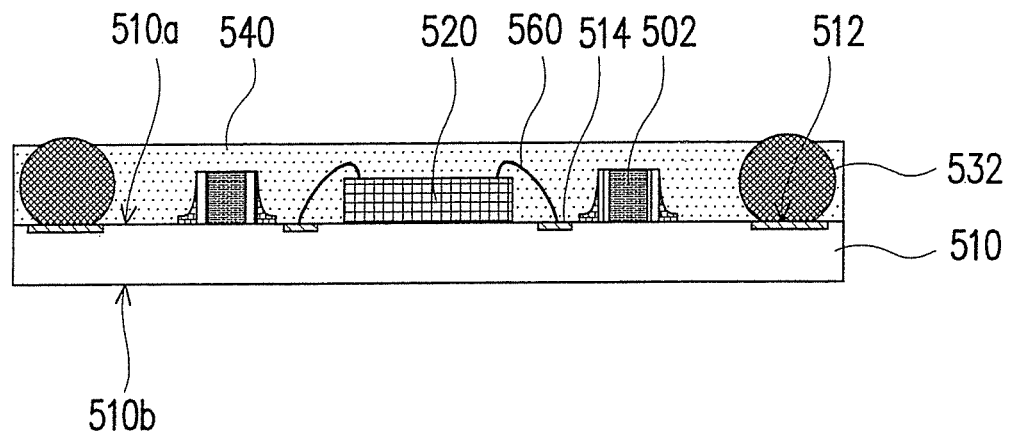

Next, as shown in FIG. 6C, the first conductive elements 532 are formed on the corresponding common contacts 512. In the embodiment, the first conductive elements 532 are fabricated by forming a solder ball on each common contact 512 respectively. Then, as shown in FIG. 6D, the encapsulation 540 is formed on the whole carrying surface 510a of the carrier to encapsulate the chip 520, the peripheral devices 502, the common contacts 512, the bonding pads 514, the wires 560 and the first conductive elements 532. It is noted that the encapsulation 540 shall expose a top portion of each first conductive element 532.

Figure 6E:
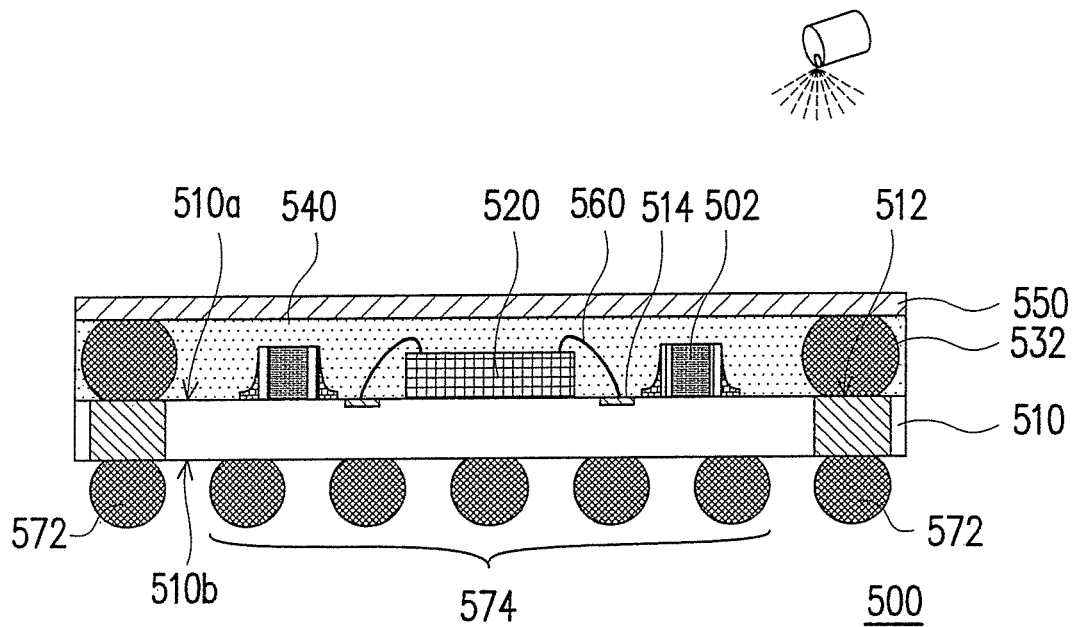

Thereafter, as shown in FIG. 6E, the conductive film 550 is formed by spraying a conductive material on the top surface of the encapsulation 540. Therefore, the conductive film 550 can be electrically connected to the common contacts 512 via the first conductive elements 532. After that, the solder balls 572 and 574 can be selectively formed on the back surface 510b of the carrier 510, wherein the solder balls 572 and 574 are electrically connected with the chip 520, the peripheral devices 502 and/or the first conductive elements 532 via the carrier 510 respectively.

It is noted that the above fabricating process as shown in FIGS. 6A-6E focuses on a single chip package. Practically, the above fabricating process is applied on an array type carrier and then forms a plurality of chip packages at the same time. Thus, a singulation process may further be carried out after the steps mentioned above to achieve a single chip package.

In summary, the present invention provides structures and the fabricating method thereof to integrate a conductive film into a chip package, wherein the conductive film can be taken as a common plane, so as to solve the problem of EMI for the chip package. Therefore, products utilizing the chip package and the chip packaging process can achieve superior electrical performance and higher reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
a carrier, including a carrying surface, a back surface opposite to the carrying surface, and a first side surface surrounding and connected between the carrying surface and the back surface, the carrier further including a plurality of common contacts adjacent to the periphery of the carrying surface;
a chip, disposed adjacent to the carrying surface and electrically connected to the carrier;
a plurality of conductive elements, disposed adjacent to and connected to the common contacts respectively;
an encapsulation, covering the carrying surface and encapsulating the chip and the conductive elements; and
a conductive film, provided with a second side surface and directly attached on a top surface of the encapsulation to cover and connect with the conductive elements,
wherein the first side surface of the carrier is coplanar with the second side surface of the conductive film, and
wherein the carrier further comprises at least one extending contact adjacent to the carrying surface, the extending contact is electrically connected with the common contacts via interconnections in the carrier, and the chip is electrically connected with the extending contact to attain a common voltage from the common contacts.

2. The chip package according to claim 1, further comprising a peripheral device disposed adjacent to the carrying surface and electrically connected to the carrier, and the encapsulation encapsulates the peripheral device.

3. The chip package according to claim 1, wherein the conductive elements comprise a plurality of solder balls.

4. The chip package according to claim 1, wherein the conductive film is a metal film.

5. The chip package according to claim 1, wherein the carrier is a circuit substrate.

6. The chip package according to claim 1, further comprising a plurality of wires connected between the chip and the carrier and encapsulated by the encapsulation.

7. The chip package according to claim 1, further comprising a plurality of solder balls disposed adjacent to the back surface of the carrier, the solder balls being electrically connected with at least one of the chip and the conductive elements via the carrier respectively, a subset of the solder balls is located adjacent to the center of the back surface of the carrier, and another subset of the solder balls is located adjacent to the periphery of the back surface of the carrier.

* * * * *